United States Patent
Ni et al.

(10) Patent No.: US 7,869,218 B2
(45) Date of Patent: Jan. 11, 2011

(54) LIGHT-WEIGHT SOLID STATE DRIVE WITH RIVET SETS

(75) Inventors: Jim Chin-Nan Ni, San Jose, CA (US);
Siew S. Hiew, San Jose, CA (US);
Abraham C. Ma, Fremont, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 357 days.

(21) Appl. No.: 12/172,164

(22) Filed: Jul. 11, 2008

(65) Prior Publication Data

US 2008/0266816 A1 Oct. 30, 2008

Related U.S. Application Data

(60) Continuation-in-part of application No. 11/872,685, filed on Oct. 15, 2007, now abandoned, which is a division of application No. 10/990,887, filed on Nov. 16, 2004, now Pat. No. 7,301,776, application No. 12/172,164, which is a continuation-in-part of application No. 11/683,292, filed on Mar. 7, 2007, now Pat. No. 7,576,990, and a continuation-in-part of application No. 11/309,843, filed on Oct. 11, 2006, now Pat. No. 7,649,742, and a continuation-in-part of application No. 11/929,917, filed on Oct. 30, 2007, now Pat. No. 7,517,231.

(51) Int. Cl.
*H05K 1/14* (2006.01)
(52) U.S. Cl. ........................ 361/737; 361/741; 439/76.1
(58) Field of Classification Search ................. 361/727, 361/732–752, 684; 439/76.1, 906; 257/679
See application file for complete search history.

(56) References Cited

U.S. PATENT DOCUMENTS

| 5,206,792 | A | | 4/1993 | Reynolds |
| 5,330,360 | A | | 7/1994 | Marsh et al. |
| 5,413,490 | A | | 5/1995 | Tan et al. |
| 5,476,387 | A | | 12/1995 | Ramey et al. |
| 5,477,426 | A | | 12/1995 | Bethurum |
| 5,488,523 | A | | 1/1996 | Seaver et al. |
| 5,496,181 | A | * | 3/1996 | Addison et al. ............... 439/61 |
| 5,563,769 | A | | 10/1996 | MacGregor |
| 5,574,628 | A | * | 11/1996 | Persia et al. ................. 361/737 |
| 5,641,301 | A | * | 6/1997 | Klein .......................... 439/377 |
| 5,768,110 | A | | 6/1998 | Frommer et al. |
| 6,191,950 | B1 | * | 2/2001 | Cox et al. .................... 361/737 |

(Continued)

*Primary Examiner*—Hung S Bui
(74) *Attorney, Agent, or Firm*—Bever, Hoffman & Harms, LLP; Patrick T. Bever

(57) ABSTRACT

A Solid State Drive (SSD) device includes a printed circuit board assembly (PCBA) defining rivet holes, and a support structure including parallel side frame rails defining rivet openings and support platforms for receiving and supporting the PCBA. Compression-mated rivet sets are used to connect the PCBA to the support structure, each rivet set including a female rivet portion and an associated male rivet portion. The PCBA is mounted onto the support structure such that the rivet holes are aligned with the rivet openings of the plurality of rivet openings, and then the rivet sets are mounted and secured using an automatic rivet tool such that each rivet set extends through an associated rivet hole/opening and fixedly engaged such that the PCBA and the support structure are held between end caps of the respective male and female rivet portions.

16 Claims, 15 Drawing Sheets

U.S. PATENT DOCUMENTS

| | | |
|---|---|---|
| 6,256,878 B1 | 7/2001 | Keane |
| 6,320,252 B1 | 11/2001 | Potters et al. |
| 6,430,000 B1 | 8/2002 | Rent |
| 6,493,233 B1 | 12/2002 | De Lorenzo et al. |
| 6,519,110 B2 | 2/2003 | Dague et al. |
| 6,890,189 B1 | 5/2005 | Wu |
| 6,908,339 B2 | 6/2005 | Tanaka |
| 7,008,240 B1 | 3/2006 | Wang et al. |
| 7,019,980 B2 | 3/2006 | Gu |
| 7,034,223 B2 | 4/2006 | Fan et al. |
| 7,113,392 B2 | 9/2006 | Lu et al. |
| 7,479,017 B1 * | 1/2009 | Koopman et al. ............ 439/67 |
| 2002/0097556 A1 | 7/2002 | Lee |
| 2004/0240190 A1 * | 12/2004 | Hsu et al. ................. 361/797 |
| 2005/0164532 A1 | 7/2005 | Ni et al. |
| 2006/0041783 A1 | 2/2006 | Rabinovitz |
| 2006/0228910 A1 | 10/2006 | Nishizawa et al. |

\* cited by examiner

LIGHT-WEIGHT SOLID STATE DRIVE WITH RIVET SETS

RELATED APPLICATIONS

This application is a continuation-in-part (CIP) of application for "Light-Weight Flash Hard Drive with Plastic Frame", U.S. Ser. No. 11/872,685, filed Oct. 15, 2007, which is a divisional of "Light-Weight Flash Hard Drive With Plastic Frame", U.S. Ser. No. 10/990,887, filed Nov. 16, 2004, now U.S. Pat. No. 7,301,776.

The present application is also a continuation-in-part of co-owned and co-pending U.S. application Ser. No. 11/683,292, filed on Mar. 7, 2007, entitled "Thin Hard Drive with 2-Piece-Casing and Ground Pin Standoff to Reduce ESD Damage to Stacked PCBA's", and U.S. application Ser. No. 11/309,843, filed Oct. 11, 2006, entitled "Thin Flash-Hard-Drive with Two-Piece Casing".

The present application is also a continuation-in-part of co-pending U.S. application Ser. No. 11/929,917, filed on Oct. 30, 2007, entitled "Solid State Drive (SSD) with Open Top and Bottom Covers".

FIELD OF THE INVENTION

The present invention generally pertains to flash hard drive-like devices, and more particularly to methods for manufacturing SSD (Solid State Drive) devices using low cost rivet sets and riveting tools.

BACKGROUND OF THE INVENTION

Integrated Drive Electronics (IDE) hard-disk drive (HDD) devices have been used for mass data storage in computer systems for many years. While the use of IDE HDD devices is still a method of choice in stationary "desk top" computer systems (e.g., "desktop" personal computers (PCs)), IDE HDD devices have been found less desirable in portable computer systems (e.g., laptop computers), which require combination of high durability, high reliability, and low weight. Accordingly, in such portable systems, Solid State Drive (SSD) devices have been used in place of IDE HDD devices due to their advantage of exhibiting better survivability in rugged environments, higher durability, higher reliability, higher performance, lower power consumption, and lower weight than IDE HDD devices.

SSD (aka, flash hard drive) devices are solid-state IC devices without any moving parts because, unlike IDE HDD devices which access data stored on a spinning disk, all data is stored on flash memory integrated circuit (IC) devices that are accessed electronically by one or more "controller" IC devices. The flash memory and controller IC devices are typically mounted on the printed circuit board (PCB) of a printed circuit board assembly (PCBA), which typically includes a standardized plug connector for connecting the SSD to a host system. SSDs currently range in size from 4 Mega-byte to 256 Gig-byte but it is anticipated that their size will increase in the future. SSDs are currently available in TSOP, WSOP, BGA, LGA, and other package types known to those in the art, and utilize one of several interface connector types (e.g., IDE, SATA, eSATA, Micro SATA, PATA, ZIF, and others known to those in the art). Flash hard drives currently run on 3.3V, 2.5V or 1.8V supply voltages, depending on the device selected. Flash hard drives typically have operating currents 1 mA,max for stand-by operations and 30 mA,max for operating current. Each flash memory IC "block" (i.e., IC device) of the flash hard drive can typically endure 100K or more Program/Erase cycles. The operating life of flash hard drives can be further extended using technologies such as Wear-Leveling.

SSD devices are produced to be a pluggable replacement for existing IDE HDD devices in certain applications (e.g., laptop computers). Thus, SSD devices are typically produced according to the common form factors for current IDE HDD devices (e.g., 3.5", 2.5", and 1.8"), and data transmissions to and from SSDs of each form factor size is consistent with its counterpart IDE HDD devices. For example, both 3.5" SSD and 3.5" IDE HDD devices use a standard 40-pin 0.100" IDE connector and a separate 4-pin power connector. In contrast, 2.5" and 1.8" SSD and IDE HDD devices use a 44-pin 2 mm IDE connector, with pins 41-43 of the connector being used for power connection. For use in host system with 3.5" HDD environment, the 2.5" and 1.8" SSDs and IDE HDD devices need an adapter to change the standard 40-pin 0.100" IDE connector and power connector to 44-pin 2 mm IDE connector.

SSD device production typically involves forming a printed circuit board assembly (PCBA), and then housing the PCBA inside of a metal case. The PCBA is produced by mounting selected IC components (i.e., one or more flash memory IC devices and one or more controller IC devices) as well as a suitable connector onto a PCB. The PCBA is then typically mounted into a metal case formed by a pair of metal covers that mount over the PCBA such that the connector is exposed at one end. Unlike production of the PCBA, which is typically produced using well-known automated assembly systems, the process of mounting the housing over the PCBA is typically performed manually. This manual process typically involves placing the PCBA onto one of the two metal covers, and then connecting the second metal cover to the first metal cover using screws, connection fingers, locking/clipping structures, or other mechanical fasteners requiring manual assembly such that the PCBA is housed inside.

A problem associated with conventional SSD devices is that the conventional manual assembly process using existing metal cases and manually installed mechanical fasteners (e.g., metal screws) can be tedious and time consuming, which can lead to production delays and associated increased production costs and reduced throughput (production volumes). In addition, in instances when it is desirable to disassemble an SSD device to enable reworking, manually installed mechanical fasteners must be removed manually, and this process typically results in damage to the SSD device.

What is needed is an assembly structure for housing a SSD device that addresses the above problems associated with conventional SSD devices. In particular, what is needed is an SSD device that is highly durable and easy to assemble/disassemble.

SUMMARY OF THE INVENTION

The present invention is directed to method for assembling SSD devices that addresses the problems associated with conventional SSD devices by using automatically installed, two-piece compression-mated rivet sets and an associated automated riveting tool to assemble the SSD devices in a way that eliminates the need for manually installed mechanical fasteners (e.g., screws, connection fingers, or locking/clipping structures), thus simplifying the assembly process in a way that reduces the manufacturing cost and increases throughput. In addition, the rivet sets utilized in the present invention can be reliably disassembled without damaging the SSD devices by utilizing an associated rivet-removing tools, thus enabling reworking of the SSD device in the case of electrical malfunction. Also, the warranty sticker or void-if-opened label that is typically sealed to SSD devices can be eliminated with rivet sets, whereas the rivet sets once fixedly engaged will find it hard to open by the user.

In accordance with the present invention, a SSD device includes a printed circuit board assembly (PCBA), a support structure, and several rivet sets operably disposed to rigidly hold the PCBA to the support structure. The PCBA includes a printed circuit board (PCB) defining several rivet holes along opposing side edges thereof, a connector mounted on a front edge thereof, and integrated circuit (IC) devices mounted onto one or more surfaces thereof. The support structure includes a pair of parallel side frame rails that provide support platforms for receiving and supporting the side edges of the PCB, and which include several rivet openings. Each rivet set includes a female rivet portion having an end cap and an elongated body defining a central opening, and an associated male rivet portion having an end cap and an elongated second body. According to the invention, the PCBA is mounted onto the support structure such that the plug connector is exposed through a front end opening defined between the side frame rails, and each rivet hole of the PCB is aligned with a corresponding rivet opening of the support structure. The rivet sets are then used to connect the PCBA to the support structure, with each rivet set extending through an associated rivet hole and its corresponding rivet opening such that the elongated second body of the associated male rivet portion is fixedly engaged in the central opening of the associated female rivet portion, and such that the PCBA and the support structure are held between the first and second end caps. According to an embodiment of the invention, the riveting process is performed using a selected riveting tool that is constructed to automatically insert and connect the selected rivet set type (e.g., compression rivet structure or blind rivet structure), which greatly simplifies the manufacturing process.

According to an aspect of the invention, the opposing side edges of the PCB define alignment notches, and the side frame rails include alignment structures disposed such that, when the PCB is mounted onto the support structure with each said alignment structure received inside a corresponding alignment notch, the rivet holes are aligned with the rivet openings to facilitate fast and accurate assembly, thereby minimizing assembly costs.

According to an embodiment of the present invention, the PCBA includes ground plane conductors that are electrically connected to the IC devices, and at least one metal ground ring surrounding at least one of the rivet holes that is connected to the ground plane conductors. With this arrangement, when a rivet set is connected to the PCBA, one of the end caps contacts the metal ground ring, and the other end cap contacts the (metal) support structure, thereby providing an electrical connection by the rivet set between the metal ground ring and the support structure, which reduces the risk of Electrostatic Discharge (ESD) damage during assembly and shipping.

According to various alternative embodiments of the present invention, the support structure includes one or more metal parts that are secured to the PCBA by way of the rivet sets. In one embodiment, support structure includes separately formed bracket arms that are connected solely by said PCBA. In other embodiments, the support structure includes a rear end frame rail integrally connected between respective rear end portions of parallel side frame rails. In some embodiments, a front end frame rail is also connected between respective front end portions of said first and second parallel side frame rails, with the front frame rail defining a narrow section forming the front opening. In many of the disclosed embodiments, one or both sides of the PCBA are exposed by the support structure to facilitate air flow cooling of the ICs. In one embodiment, the support structure further includes a bottom plate integrally connected between lower edge portions of said rear end frame rail and said first and second parallel side frame rails, wherein each rivet set extends through a corresponding lower rivet hole formed in the bottom plate. In another embodiment, a cover is mounted onto upper edges of the support structure and secured to the support structure by the rivet sets, wherein the cover and support structure form a housing that operably encloses the PCBA (i.e., such that only the connector is accessible outside the housing).

According to a specific embodiment of the present invention, the SSD device includes two thin metal panels that are secured to the edges of a plastic frame over the PCBA by way of the rivet sets. The plastic frame includes side and back end rails that define a longitudinal platform for supporting the PCBA such that its plug connector is exposed through an open end of the frame. The metal panels are then fitted into grooves or steps formed along the rails of the plastic frame such that outer surfaces of the metal panels are flush with the upper and lower edges of the plastic frame rails. The rivets extend through pre-punched rivet holes formed along outer edges of the panels and through rivet openings formed in the plastic frame. Optional spacers are utilized to securely hold the PCBA between the metal panels. By forming SSD devices using a plastic frame and thin metal panels that are reliably secured over the PCBA by the rivets, a SSD device is formed in accordance with the present invention is both light-weight and durable, thereby providing a highly desirable storage device for portable computing systems, such as laptop computers. In particular, the light-weight flash hard drive eliminates the heavy metal casing and screws required by conventional SSD structures while providing effective protection for the enclosed electronic components and a firm and secure platform for the plug connector (so that the plug connector will not become loose and separated from the housing after extended usage), and also simplifies assembly work.

According to various other aspects of the invention, the housing is based on either of a 2.5" and 1.8" form factor, and/or allows Thin Small Outline Package (TSOP) or Very Very Small Outline Package (WSOP), or Ball Grid Array (BGA), or die bonding (e.g. COB) to PCB, etc. to be used. The aforementioned hard-disk drive interface is Integrated Drive Electronics (IDE) and according to various other aspects of the invention can be applied to Serial Advanced Technology Attachment (SATA), Small Computer Systems Interface (SCSI), etc.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in the production of SSD devices. The following description is presented to enable one of ordinary skill in the art to make and use the invention as provided in the context of a particular application and its requirements. As used herein, directional terms such as "upper", "top", "lower", "bottom", "front", "rear" and "side" are intended to provide relative positions for purposes of description, and are not intended to designate an absolute frame of reference. In addition, the phrases "integrally connected" and "integrally molded" is used herein to describe the connective relationship between two portions of a single molded or machined structure, and are distinguished from the terms "connected" or "coupled" (without the modifier "integrally"), which indicates two separate structures that are joined, for example, by way of rivet. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
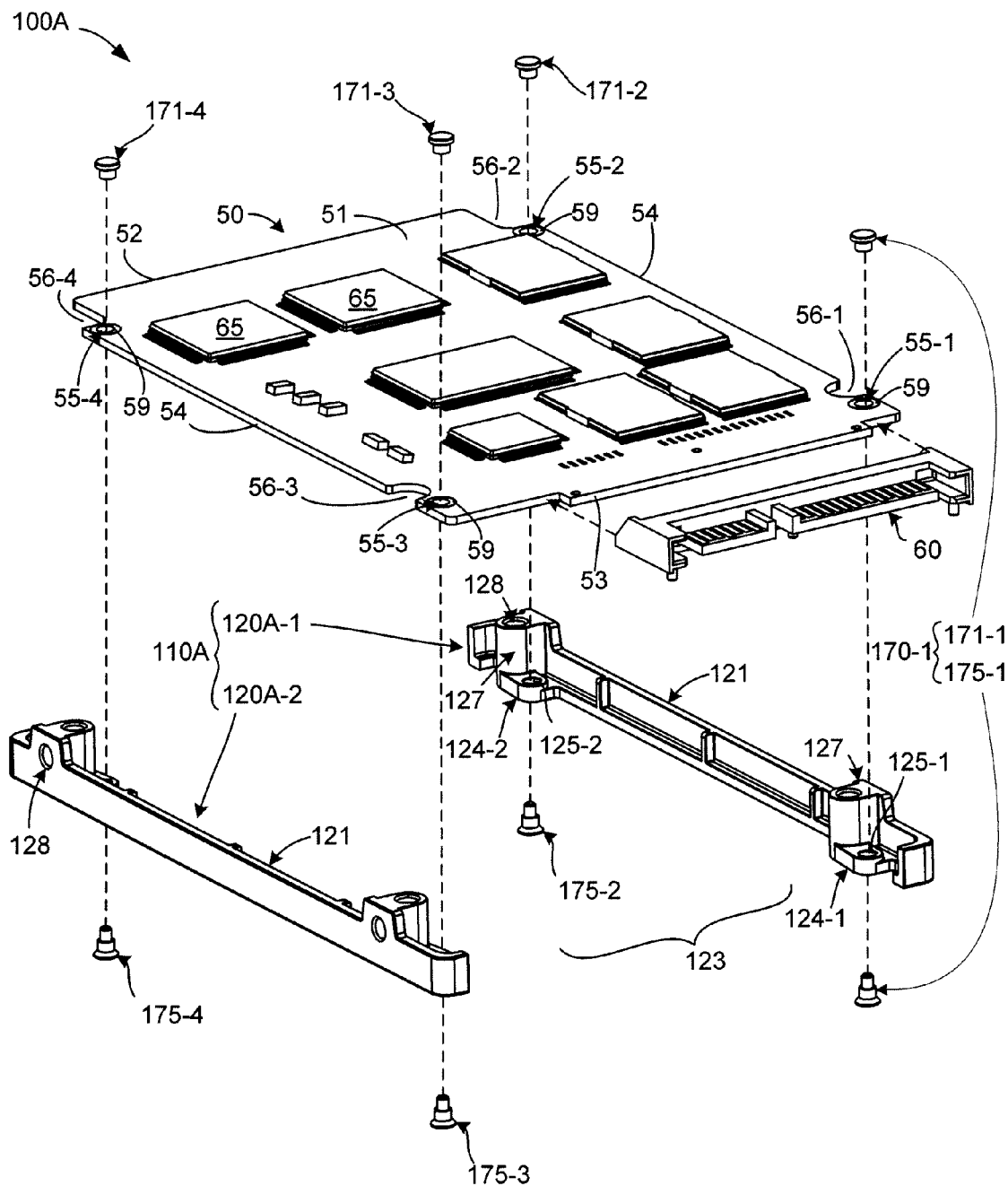
FIG. 1 is an exploded perspective view showing an SSD device according to an embodiment of the present invention.

FIG. 1 is an exploded perspective view showing a SATA SSD device 100A according to an embodiment of the present invention. SSD device 100A generally includes a PCBA 50 mounted to a support structure 110A that is generally formed by bracket arms (frame rails) 120A-1 and 120A-2. Additional features and structures of SSD device 100A are described below.

PCBA 50 generally includes a PCB 51 and a connector 60. PCB 51 is sized and constructed according to a predefined form factor, and includes one or more IC devices 65 (e.g., flash memory IC devices and one or more controller IC devices) and other optional electronic components mounted thereon. Each IC 65 has a substantially planar upper surface that is spaced from and parallel to the surfaces of PCB 51. Connector 60, which also conforms to the selected form factor, is mounted onto a front edge 53 of PCB 51, and includes pins that communicate with ICs 65 via corresponding traces (not shown) formed on PCB 51 according to well-known practices. PCB 51 also includes a back edge 52, a front edge 53, opposing side edges 54, and several optional alignment notches 56 are defined along one or more edges of PCB 51.

According to an aspect of the present invention, PCB 51 defines several rivet openings 55-1 to 55-4 that are disposed adjacent to opposing side edges 54. Rivet openings 55-1 to 55-4 pass entirely through PCB 51. In one embodiment, side frame rails 120A-1 and 120A-2 are cast or stamped from a selected metal (e.g., aluminum), and each rivet opening is surrounded by a corresponding metal ground ring 59. Metal ground rings 59 are connected to a ground conductor (ground plane) of PCB 51 that provides ground connections to each IC devices 65. As described in additional detail below, metal ground rings 59 facilitate electrical connection between the ground plane of PCBA 50 and metal side frame rails 120A-1 and 120A-2, which reduces the risk of Electrostatic Discharge (ESD) damage during assembly and shipping.

Each frame rail 120A-1 and 120A-2 of support structure 110A is cooperatively assembled with PCBA 50 to protect ICs 65 and other components mounted on PCB 51. Frame rails 120A-1 and 120A-2 include elongated rail structures 121 that are arranged in parallel when connected to PCB 51, and corresponding front ends thereof define a front end opening 123. In the present embodiment, frame rails 121A and 121B are identically elongated bracket arms formed from die-cast metal or molded plastic, and are connected by PCBA 50 (i.e., such that when assembly is completed, as shown below with reference to FIGS. 8(A) and 8(B), frame rails 121A and 121B are connected solely by way of PCBA 50). Each frame rail 120A-1 and 120A-2 (e.g., frame rail 120A-1) includes support platforms (e.g., support platforms 124-1 and 124-2) that extend from side rail 121 and define rivet openings (e.g., rivet openings 125-1 and 125-2) which collectively form connecting structures for securing PCBA 50 to support structure 110A by way of rivet sets 170-1 and 170-2 in the manner described below.

As indicated in FIG. 1, the rivet sets comprise female rivet portions 171-1 to 171-4 and male rivet portions 175-1 to 175-4 that are mounted from opposite sides of the sub-assembly formed by PCBA 50 and support structure 110A. Each rivet set (e.g., rivet set 170-1) includes a female rivet portion (e.g., portion 171-1) and an associated male rivet portion (e.g., portion 175-1) that are pressed through corresponding rivet holes (e.g., hole 55-1) and rivet openings (e.g., opening 125-1). Similarly, a second rivet set formed by female rivet portion 171-2 and male rivet portion 175-2 are pressed through corresponding rivet hole 55-2 and rivet opening 125-2, and third and fourth rivet sets formed by female rivet portions 171-3 and 171-4 and male rivet portions 175-3 and 175-4 are likewise connected through rivet holes 55-3 and 55-4 and rivet openings (not shown) formed in second frame rail 120A-2. In this manner, the four rivet sets formed by female rivet portions 171-1 to 171-4 and male rivet portions 175-1 to 175-4 are used to secure PCBA 50 to support structure 110A.

Figure 2A:
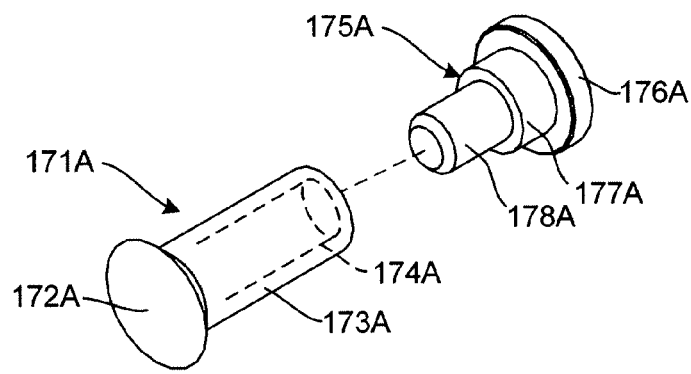
FIGS. 2(A) and 2(B) are exploded perspective and assembled perspective views, respectively, showing a two-piece rivet set utilized in the production of the SSD device of FIG. 1 according to a specific embodiment of the present invention.
Figure 2B:
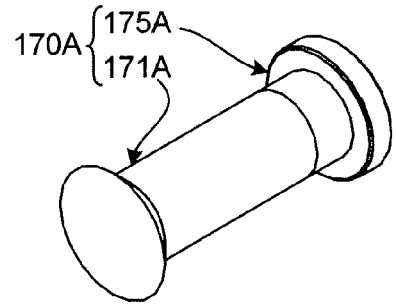

FIGS. 2(A) and 2(B) illustrate a two-piece, compression mated rivet set 170A according to an exemplary embodiment of the present invention. Rivet set 170A includes female tubular rivet portion 171A and male rivet portion 175A, and represents any of the four rivet sets shown in FIG. 1. Female rivet portion 171A includes a first end cap 172 and an elongated first body 173 defining a central opening 174, and associated male rivet portion 175A includes a second end cap 176 and a tapered elongated body 177. Female tubular rivet portion 171A and male rivet portion 175A are made out of metal (e.g., aluminum, copper, stainless steel, and etc), but could be plastic as alternative material, using known manufacturing techniques.

Figure 3:
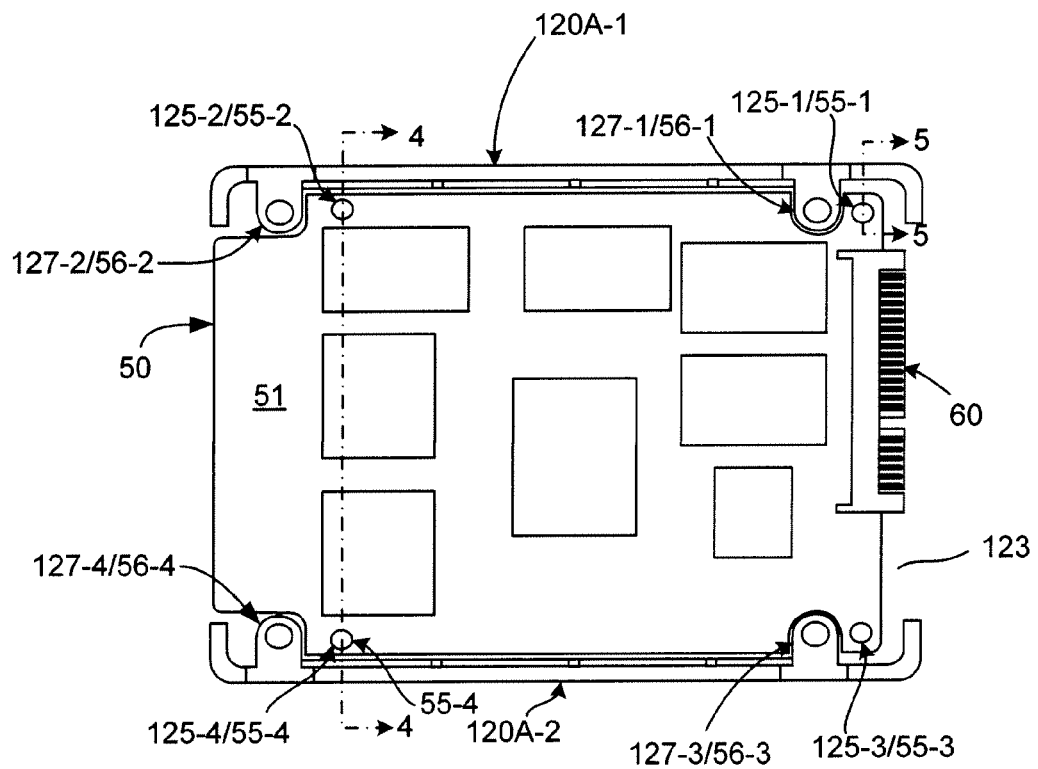
FIG. 3 is a top plan view showing portions of the SSD device of FIG. 1 during assembly.
Figure 4A:
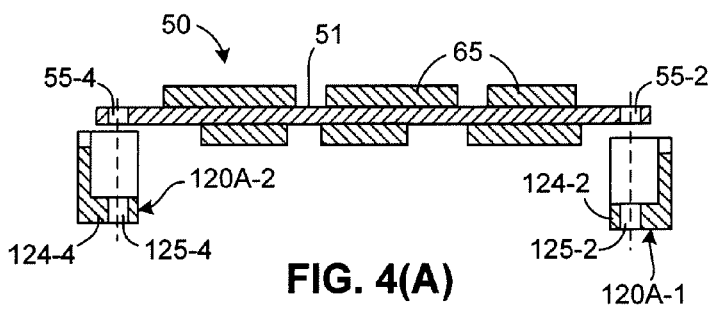
FIGS. 4(A) and 4(B) are partially exploded cross-sectional end views taken along section line 4-4 of FIG. 3.
Figure 4B:
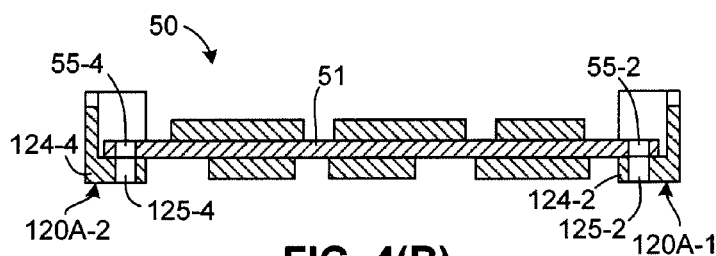

FIG. 3 is a top plan view showing SSD device 100A during assembly. In accordance with another embodiment of the invention, a method for manufacturing SSD devices (e.g., SSD device 100A) includes mounting PCBA 50 onto the associated support structure (i.e., in this embodiment, frame rails 120A-1 and 120A-2), and then connecting the PCBA to the support structure using the multiple rivet sets described above (e.g., rivet set 170-1; see FIG. 1). As shown in FIGS. 3, 4(A) and 4(B), mounting PCBA 50 onto frame rails 120A-1 and 120A-2 includes positioning plug connector 60 in front end opening 123, and aligning each rivet hole 55-1 to 55-4 with its corresponding rivet opening 125-1 to 125-4.

In accordance with an embodiment of the present invention, PCBA 50 and support structure 110A are provided with alignment structures that facilitate fast and accurate assembly, thereby minimizing assembly costs. Referring to FIG. 1, in the present embodiment, PCBA 50 is formed such that opposing side edges 54 of the PCB 51 define alignment notches 56-1 to 56-4, and side frame rails 120A-1 and 120A-2 include alignment structures 127-1 to 127-4. These notches and structures are disposed such that, as indicated in FIG. 3, when PCB 51 is mounted onto side frame rails 120A-1 and 120A-2 such that each said alignment structure 127-1 to 127-4 is received inside a corresponding alignment notch 56-1 to 56-4, respectively, each said rivet hole 55-1 to 55-4 is aligned with its corresponding rivet opening 125-1 to 125-4, respectively. Referring back to FIG. 1, note that each alignment structure (e.g., alignment structure 127-2) includes a screw hole 128, and screw holes 128 are also defined through elongated rail structures 121, which are utilized to secure the fully assembled SSD device into a host system according to known techniques.

Figure 5A:
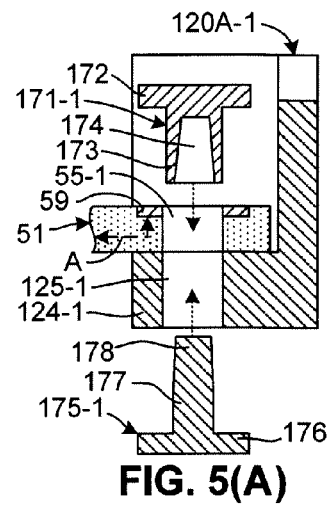
FIGS. 5(A) and 5(B) are cut-away cross-sectional end views taken along section line 5-5 of FIG. 3 during assembly of the SSD device of FIG. 1.
Figure 5B:
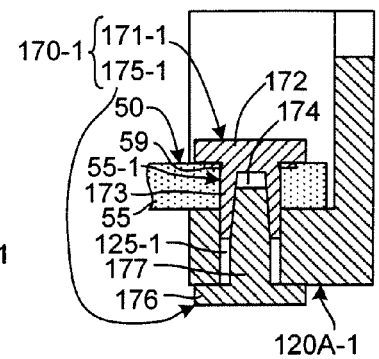

Next, as indicated in FIGS. 5(A) and 5(B), each rivet set (e.g., rivet set 170-1) is connected to the sub-assembly by inserting the tubular body 173 of the associated female rivet portion (e.g., 171-1) through its corresponding rivet hole (e.g., rivet hole 55-1) and inserting the elongated body 177 of the corresponding male rivet portion (e.g., portion 175-1) through the corresponding rivet opening (e.g., opening 125-1) such that elongated body 177 enters central opening 174 and becomes fixedly engaged (i.e., due to the slight interference fit) to body 173 of the associated female rivet portion 171-1. As indicated in FIG. 4(B), in this manner PCBA 50 and the support structure are held between the first and second end caps 172 and 176.

Referring to FIGS. 1, 5(A) and 5(B), according to an aspect of the first embodiment, PCBA 50 includes ground plane conductors (not shown) that are electrically connected to the IC devices 65, and one or more metal ground rings 59 surrounding at least one of rivet holes 55-1 to 55-4 that are connected to the ground plane conductors (as depicted by the double-headed arrow in FIG. 5(A)). With this arrangement, as indicated in FIG. 5(B), when rivet set 170-1 is connected to PCBA 50, end cap 172 of female rivet portion 171-1 contacts metal ground ring 59, and end cap 176 of male rivet portion 175-1 contacts the (metal) support structure 120A-1, thereby providing an electrical connection by rivet set 170-1 between metal ground ring 59 and the support structure 120-1, which reduces the risk of ESD damage during assembly and shipping.

Figure 6A:
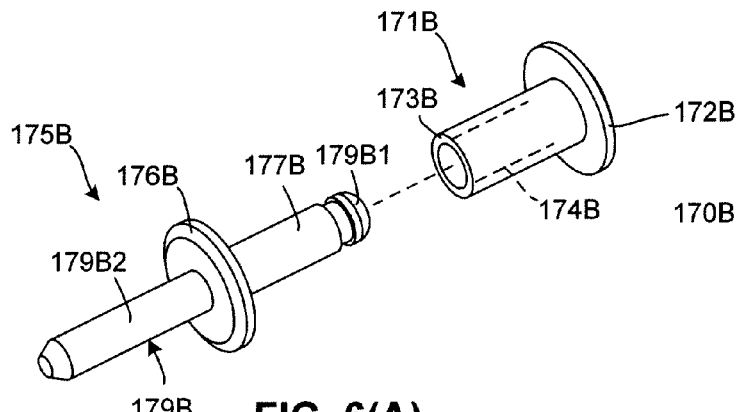
FIGS. 6(A) and 6(B) are exploded perspective and assembled perspective views, respectively, showing another two-piece rivet set utilized in the production of the SSD device of FIG. 1 according to another specific embodiment of the present invention.
Figure 6B:
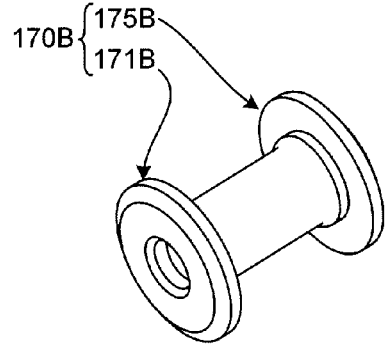

Although the present embodiment is described above with reference to compression mated rivet set 170A (FIG. 2), those skilled in the art will recognize that other types of rivet sets may also be used. FIGS. 6(A) and 6(B) illustrate an alternative rivet set 170B which consists of a female tubular rivet portion 171B and a male blind rivet portion 175B. Female tubular rivet portion 171B includes an end cap 172B and a hollow tube body 173B defining a central opening 174B. Male blind rivet portion 175B includes an end cap 176B, a tubular body 177B, and an actuating rod 179B having an enlarged mandrel 179B1 at one end and a guide rod 179B2 extending through tubular body 177B and exposed through the opposite end. During assembly, guide rod 179B2 is received inside a rivet tool when male rivet portion 175B is mounted through a corresponding rivet opening/hole in the manner described above. When tubular body 177B is received inside central opening 173B, the rivet tool is caused to pull on guide rod 179B2, which pulls mandrel 179B1 through tubular body 177B in a way that deforms tubular body 177B outward against the inside surface of tubular body 173B. As a result, the diameter of the deformed tubular body 177B becomes larger than the inner diameter of tubular body 173B, thereby securing male rivet portion 175B to female rivet portion 171B. The expose portion of guide rod 179B2 is then cut and removed from male rivet portion 175B. Fast, easy-to use blind rivet set 170B offers speed of assembly, consistent mechanical performance and excellent installed appearance, making blind riveting a reliable and economical assembly method.

Figure 7A:
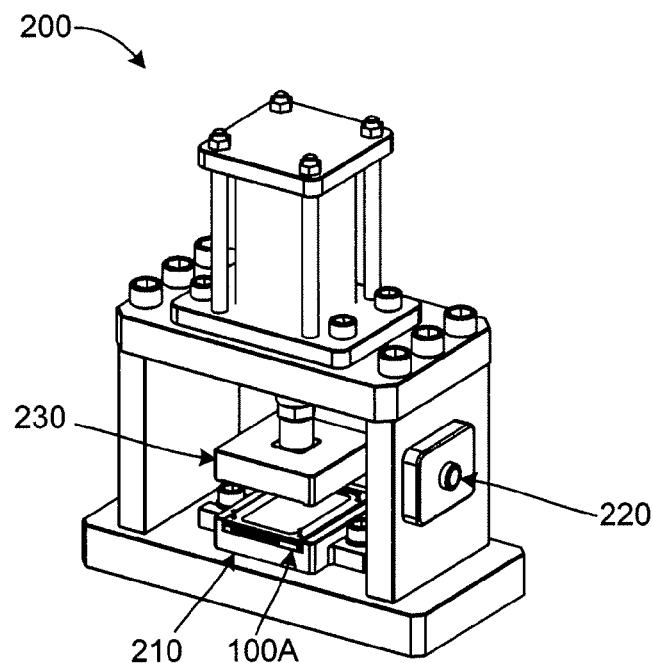
FIGS. 7(A) and 7(B) are perspective views showing alternative rivet tools utilized in the production of the SSD device of FIG. 1 according to alternative embodiments of the present invention.
Figure 7B:
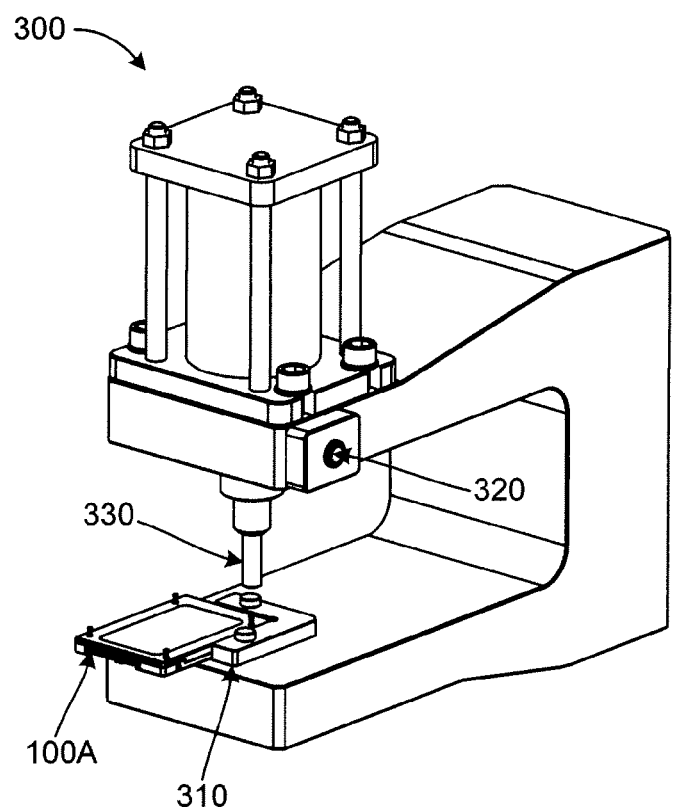

According to an embodiment of the invention, the riveting process is performed using a automatic riveting tool that is constructed to automatically connect the selected rivet set type (e.g., compression rivet structure 170A (FIGS. 2(A) and 2(B)) or blind rivet structure 170B (FIGS. 6(A) and 6(B)), which greatly simplifies the manufacturing process. FIG. 7(A) shows an air-powered riveting tool 200, and FIG. 7(B) shows a single compression rivet tool 300 that are used according to alternative embodiments. As indicated in FIGS. 7(A) and 7(B), rivet sets are set in pre-punched rivet holes/openings in the manner described above, and then the substantially assembled SSD device 100A is mounted onto a die 210/310 of air powered rivet tool 200/300 with rivet portions extending therefrom. An operator (not shown) then presses a start button 220/320, causing a plunger 230/330 to punch the rivet sets, which causes the male rivet portions to be pressed into the female tubular rivet portions, thereby fastening the PCBA and support structure together and forming a punch rivet connection that securely joins the two-piece rivet set in a manner that prevents pullout. Air pressure or stroke is adjustable for different rivet lengths during riveting.

Figure 8A:
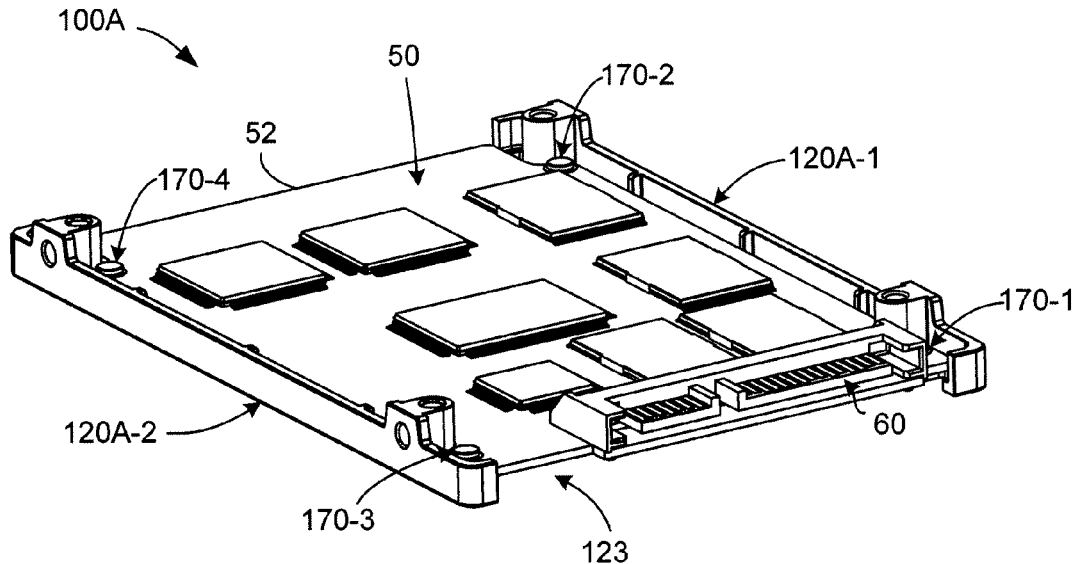
FIGS. 8(A) and 8(B) are top and bottom perspective views, respectively, showing the SSD device of FIG. 1 in a fully assembled state.
Figure 8B:
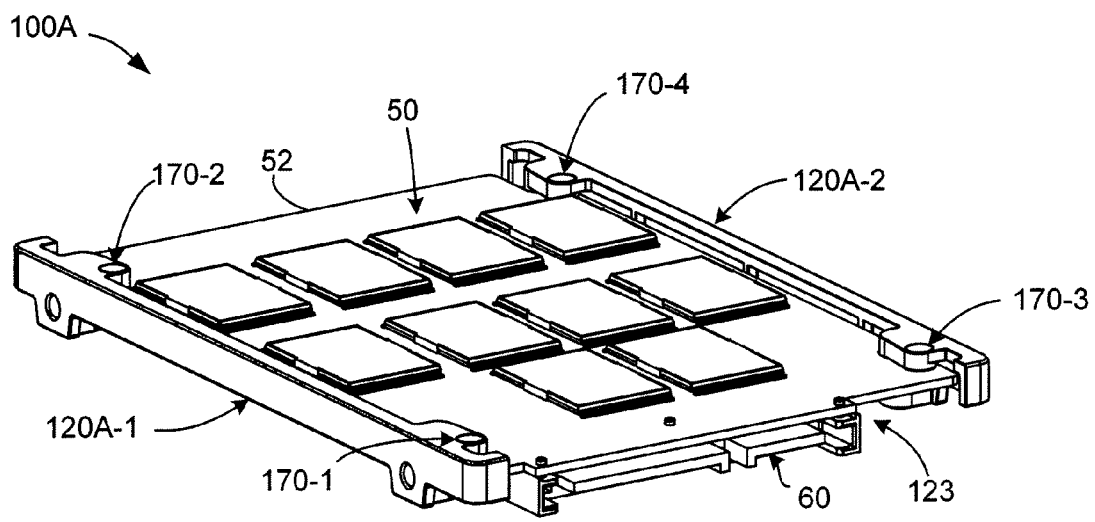

FIGS. 8(A) and 8(B) show flash hard drive 100A after PCBA 50 is attached to frame rails 120A-1 and 120A-2 by the rivet sets 170-1 to 170-4. Note that connector 60 is exposed through front end opening 123 defined between frame rails 120A-1 and 120A-2, rear edge 52 of PCBA 50 is exposed, and frame rails 120A-1 and 120A-2 extend along and protect the side edges of PCB 51. Note also that both upper and lower surfaces of PCBA 50 are exposed in this embodiment in order to maximize cooling. In addition, note that frame rails (bracket arms) 120A-1 and 120A-2 are connected solely by PCBA 50.

Although the present invention has been described to this point with reference to a generalized embodiment in which support structure 110A includes two separate pieces in order to minimize weight and maximize cooling, those skilled in the art will recognize that several alternative support structures and other details are possible without altering the spirit and scope of the invention. Several embodiments are provided below with reference to FIGS. 9-17 in order to illustrate various exemplary features. These embodiments are not intended to be exhaustive or limiting to the claims unless their specific features are recited therein.

Figure 9:
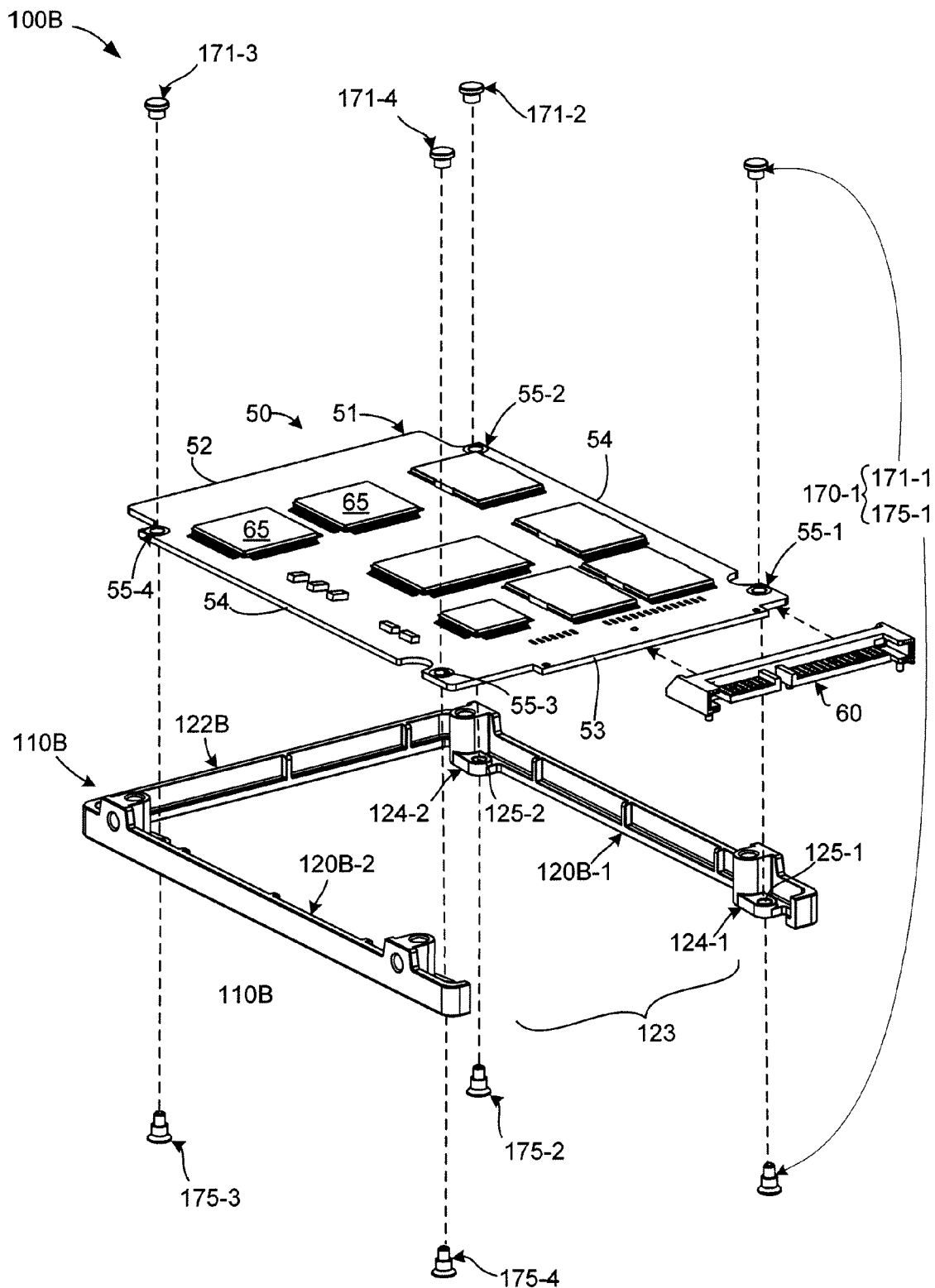
FIG. 9 is an exploded perspective view showing an SSD device according to another embodiment of the present invention.
Figure 10A:
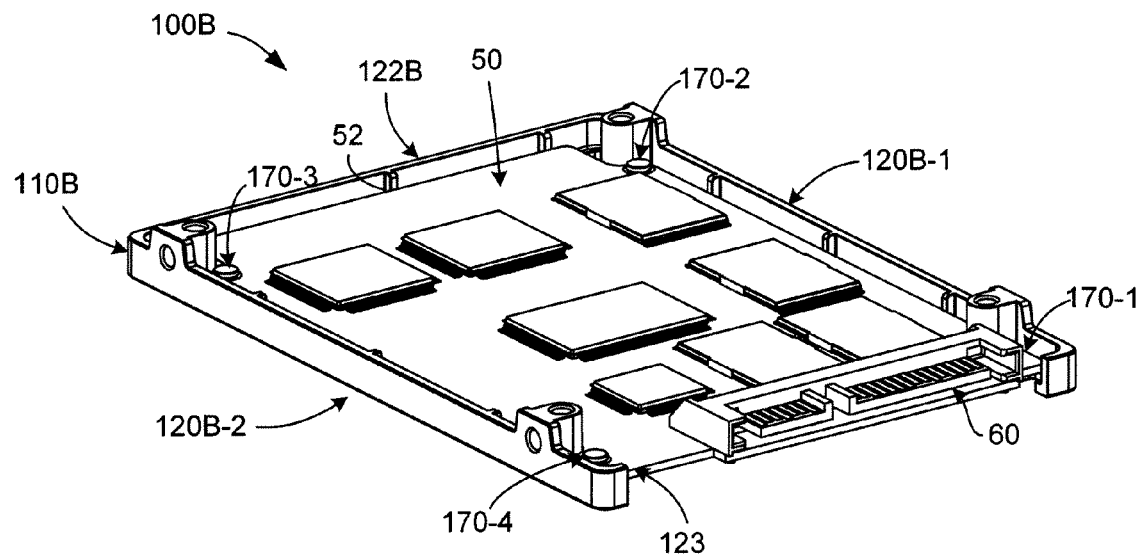
FIGS. 10(A) and 10(B) are top and bottom perspective views, respectively, showing the SSD device of FIG. 9 in a fully assembled state.
Figure 10B:
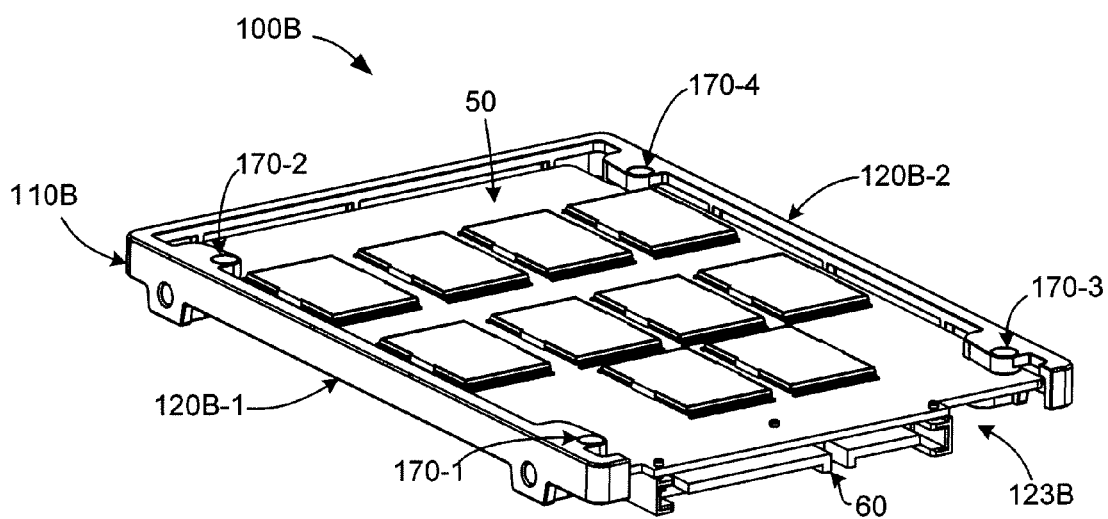

FIGS. 9, 10(A) and 10(B) are exploded and assembled perspective views showing an SSD device 100B according to a first alternative embodiment. Similar to SSD device 100A, SSD device 100B includes PCBA 50, a support structure 110B, and multiple rivet sets (e.g., rivet set 170-1) including female rivet portions 171-1 to 171-4 that extend through rivet holes 55-1 to 55-4 defined in PCB 51, and male rivet portions 175-1 to 175-4 that extend through corresponding rivet openings (e.g., openings 125-1 and 125-2) in the manner described above. Note that support structure 110B includes side frame rails 120B-1 and 120B-2 that are similar to those of the first embodiment (described above), but are integrally connected (i.e., co-molded or formed) by a rear end frame rail 122B in order to simplify the assembly process by holding side frame rails 120B-1 and 120B-2 in the proper orientation. As indicated in FIGS. 10(A) and 10(B), when fully assembled, rivet sets 170-1 to 170-4 connect PCBA 50 to support structure 110B in a manner similar to that described above (e.g., with connector 60 exposed through front end opening 123), but in this case rear end frame rail 122B covers and protects rear edge 52 of PCBA 50.

Figure 11:
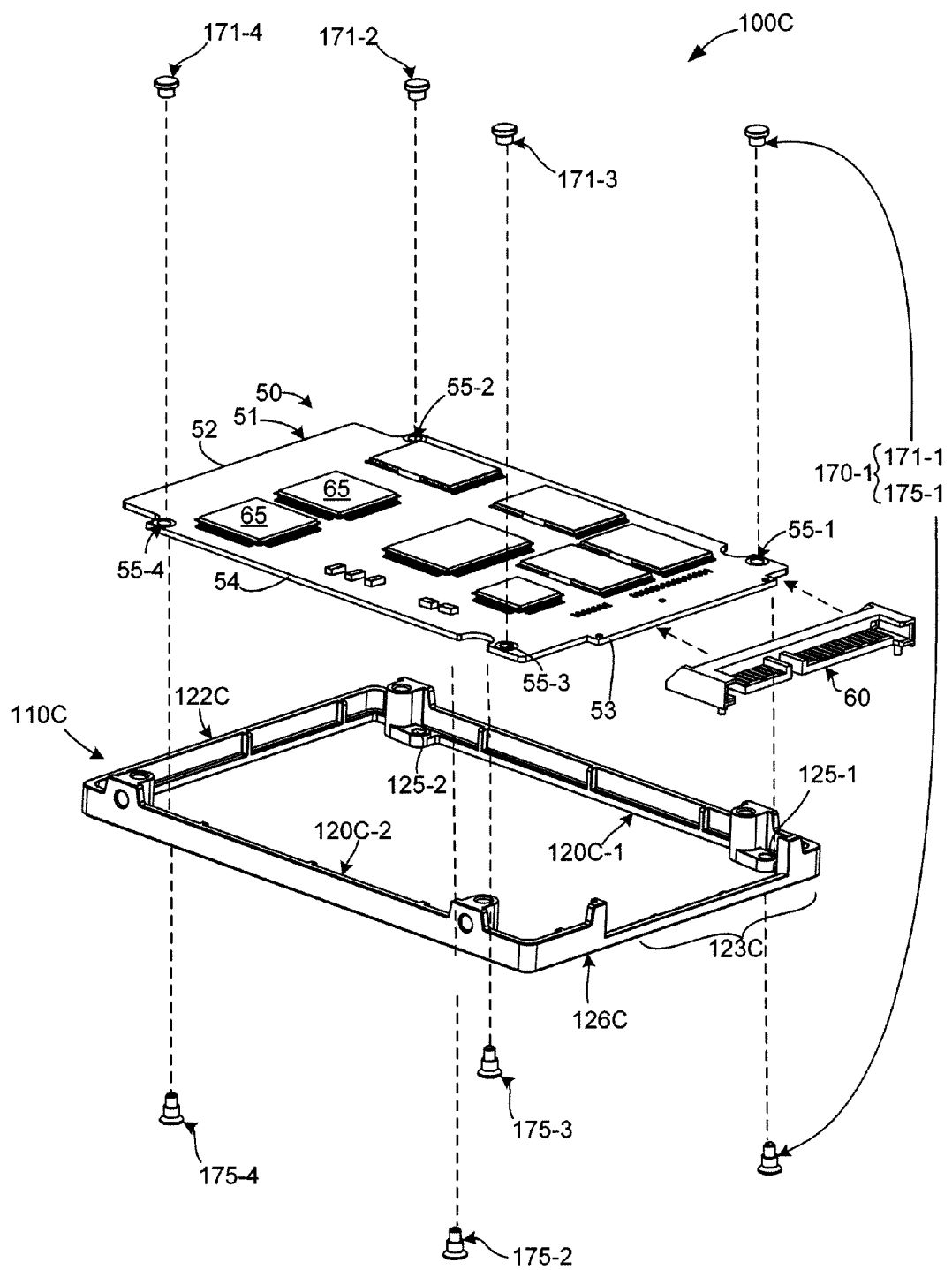
FIG. 11 is an exploded perspective view showing an SSD device according to another embodiment of the present invention.
Figure 12A:
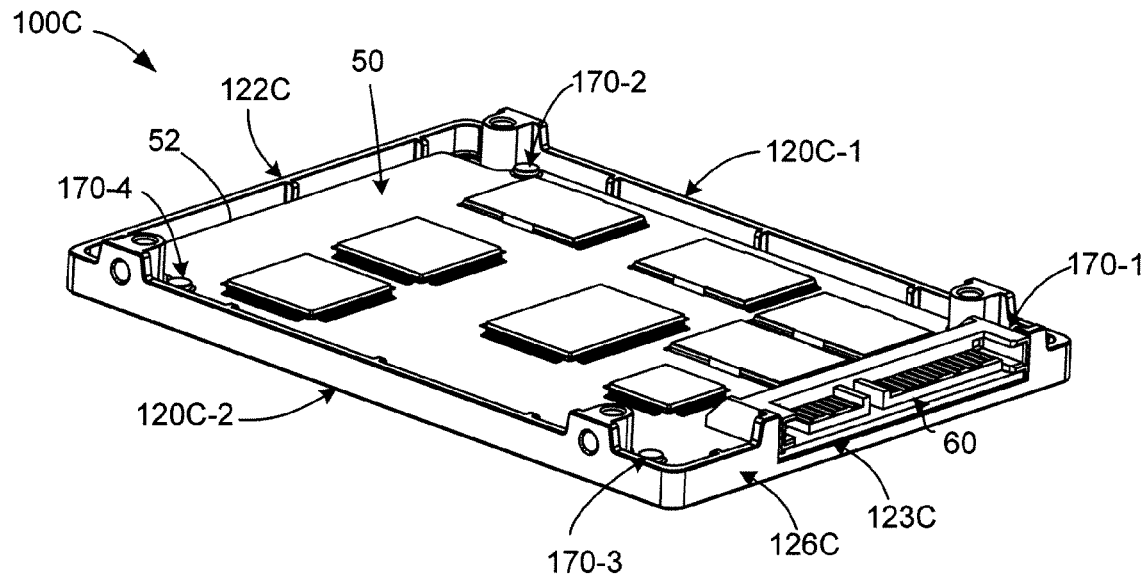
FIGS. 12(A) and 12(B) are top and bottom perspective views, respectively, showing the SSD device of FIG. 11 in a fully assembled state.
Figure 12B:
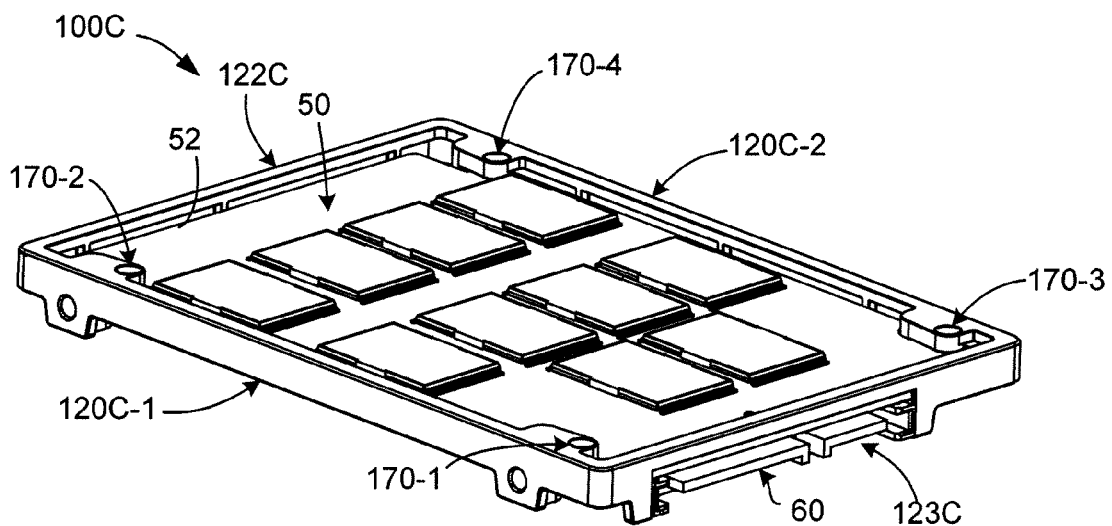

FIGS. 11, 12(A) and 12(B) are exploded and assembled perspective views showing an SSD device 100C according to a second alternative embodiment. Similar to SSD devices 100A and 100B, SSD device 100C includes PCBA 50, a support structure 110C, and multiple rivet sets (e.g., rivet set 170-1) including female rivet portions 171-1 to 171-4 that extend through rivet holes 55-1 to 55-4 defined in PCB 51, and male rivet portions 175-1 to 175-4 that extend through corresponding rivet openings (e.g., openings 125-1 and 125-2) in the manner described above. Note that support structure 110C is a die-cast metal frame including side frame rails 120C-1 and 120C-2 that are similar to those of the first embodiment (described above), and an integrally connected rear end frame rail 122C similar to those of the second embodiment (also described above), and also includes a front end frame rail 126C integrally connected between respective front end portions of side frame rails 120C-1 and 120C-2. Note that front end frame rail 126C defines front opening 123C, which in this case is defined by a relatively short section of front end frame rail 126C. The addition of front end frame rail 126C further simplifies the assembly process by holding side frame rails 120B-1 and 120B-2 in the proper orientation. As indicated in FIGS. 12(A) and 12(B), when fully assembled, rivet sets 170-1 to 170-4 connect PCBA 50 to support structure 110C in a manner similar to that described above (e.g., with connector 60 exposed through front end opening 123C), but in this case front end frame rail 126C covers and protects front edge 53 of PCBA 50.

Figure 13:
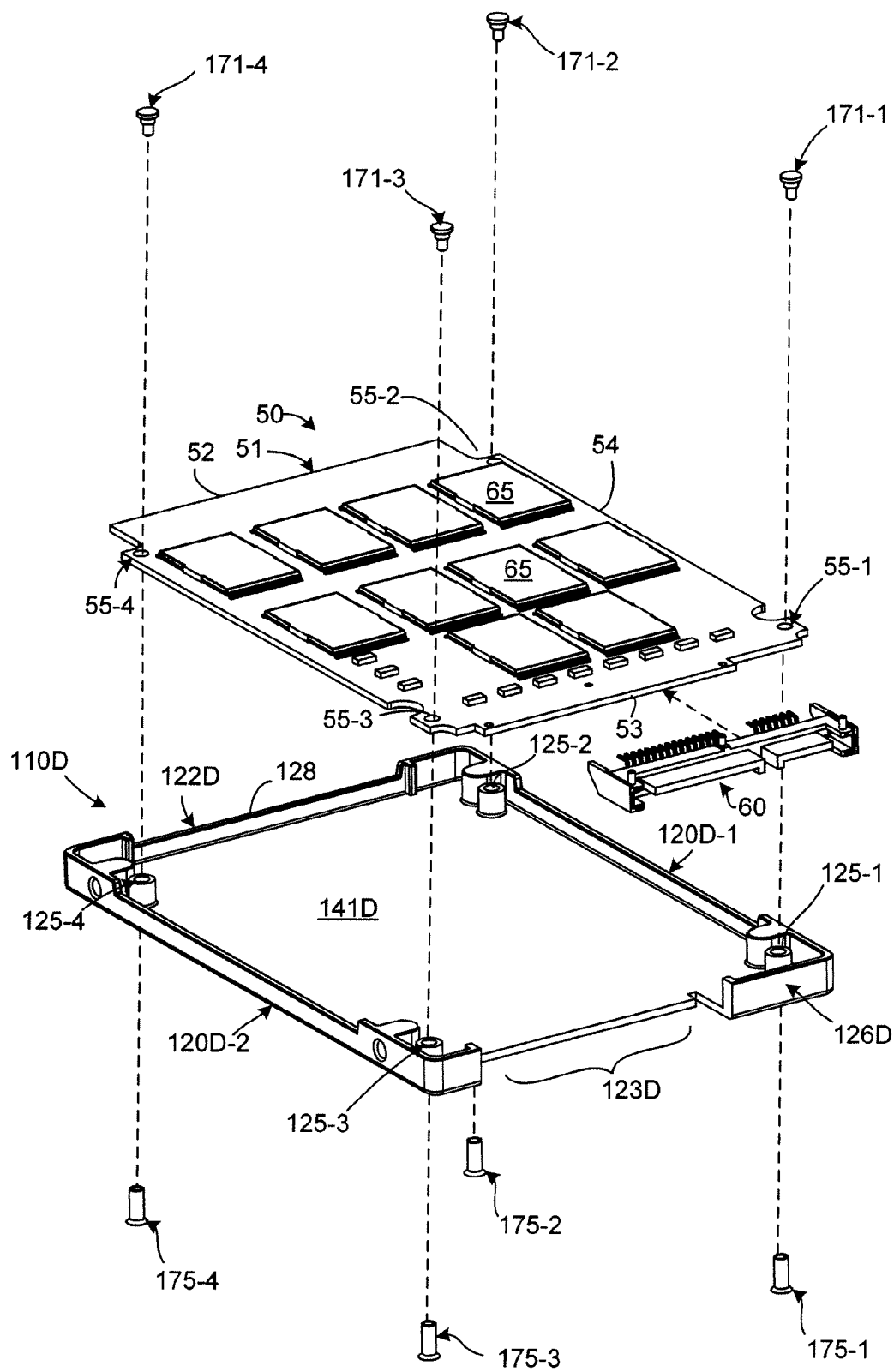
FIG. 13 is an exploded perspective view showing an SSD device according to another embodiment of the present invention.
Figure 14A:
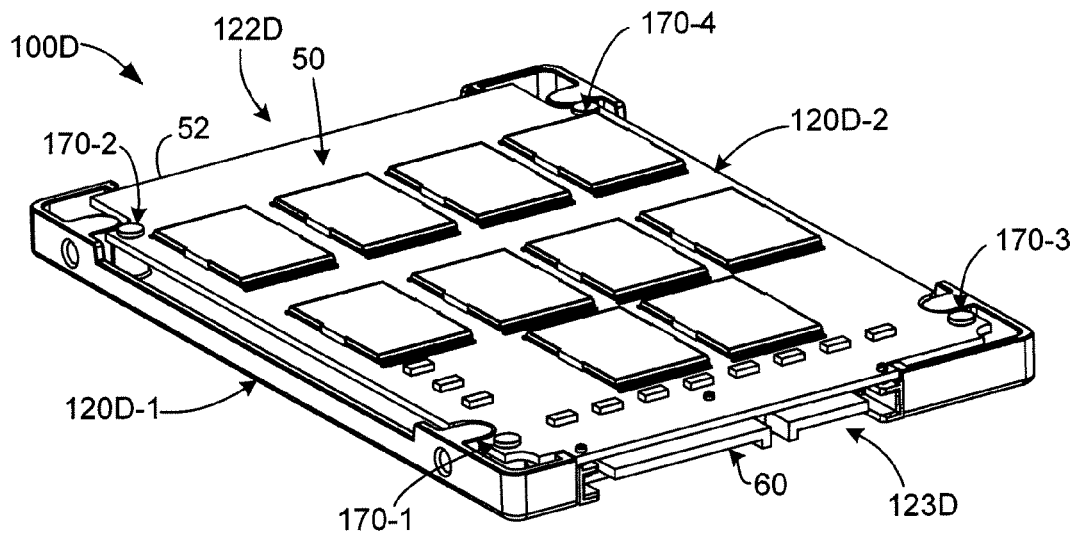
FIGS. 14(A) and 14(B) are top and bottom perspective views, respectively, showing the SSD device of FIG. 13 in a fully assembled state.
Figure 14B:
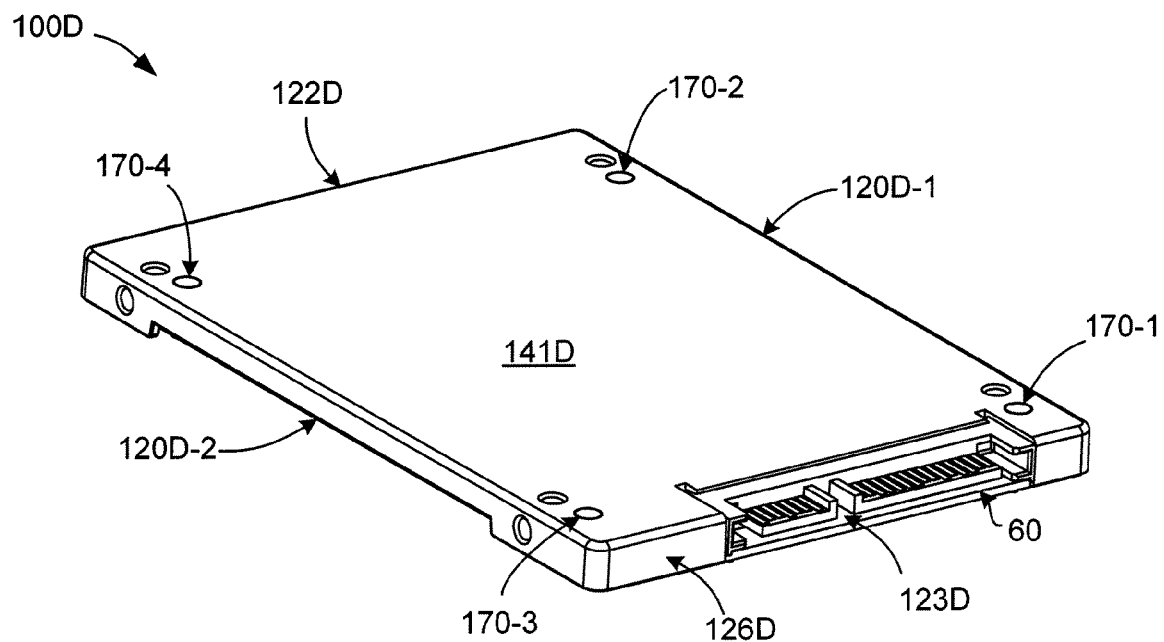

FIGS. 13, 14(A) and 14(B) are exploded and assembled perspective views showing an SSD device 100D according to a third alternative embodiment. Similar to SSD devices 100A and 100B, SSD device 100D includes PCBA 50 mounted on a support structure 110D and secured by multiple rivet sets (e.g., rivet set 170-1) including female rivet portions 171-1 to 171-4 that extend through rivet holes 55-1 to 55-4 defined in PCB 51, and male rivet portions 175-1 to 175-4 that extend through corresponding rivet openings (e.g., openings 125-1 and 125-2) in the manner described above. Support structure 110D is a die-cast metal frame including side frame rails 120D-1 and 120D-2, and an integrally connected rear end frame rail 122D, and also includes a front end frame rail 126D defining front opening 123D. In addition, support structure 110D further includes a bottom plate 141D integrally connected between lower edge portions of rear end frame rail 122D and side frame rails 120D-1 and 120D-2. Note that rivet holes 125-1 to 125-4 extend through bottom plate 141D such that, as indicated in FIG. 14(B), associated portions of rivet sets 170-1 to 170-4 are exposed on the lower surface of bottom plate 141D. The addition of bottom plate 141D provides additional protection for PCBA 50 by covering the lower surface thereon. As indicated in FIGS. 14(A) and 14(B), when fully assembled, rivet sets 170-1 to 170-4 connect PCBA 50 to support structure 110D in a manner similar to that described above (e.g., with connector 60 exposed through front end opening 123D), but in this case only the upper surface of PCBA 50 is exposed (as shown in FIG. 14(A)).

Figure 15:
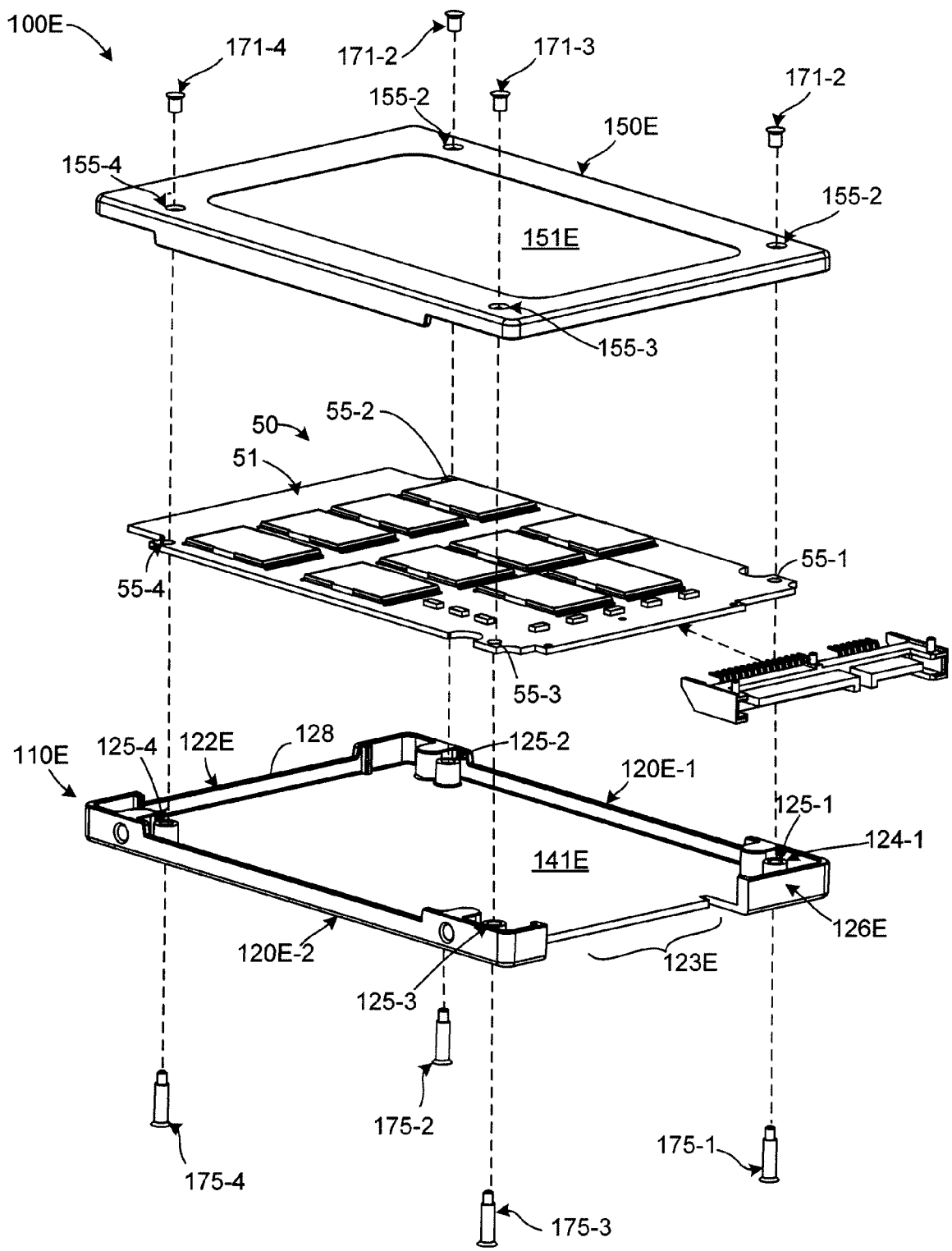
FIG. 15 is an exploded perspective view showing an SSD device according to another embodiment of the present invention.
Figure 16A:
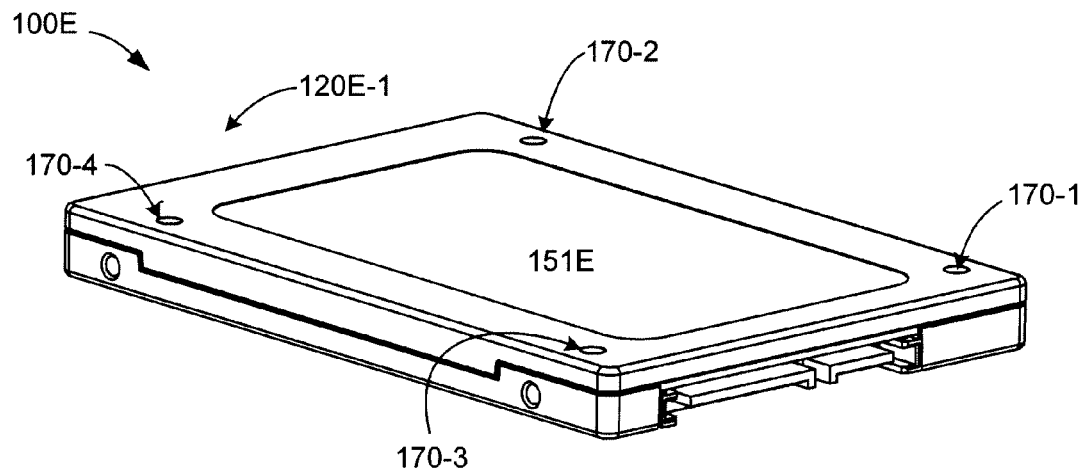
FIGS. 16(A) and 16(B) are top and bottom perspective views, respectively, showing the SSD device of FIG. 15 in a fully assembled state.
Figure 16B:
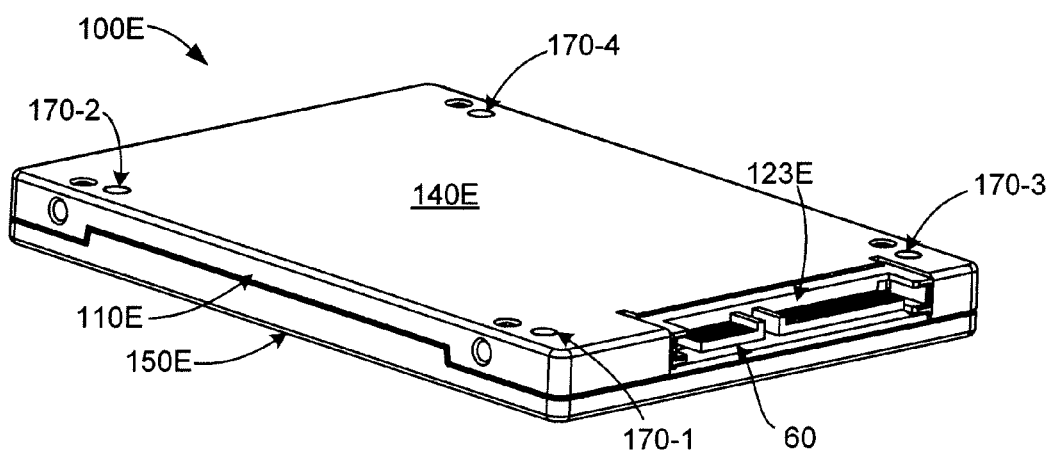

FIGS. 15, 16(A) and 16(B) are exploded and assembled perspective views showing an SSD device 100E according to a fourth alternative embodiment. Similar to the SSD device 100D, SSD device 100E includes PCBA 50 mounted on a support structure 110E having side frame rails 120E-1 and 120E-2, rear end frame rail 122E, front end frame rail 126E, and a bottom plate 141E. However, SSD device 100E also includes a cover 150E mounted onto upper edges of side frame rails 120E-1 and 120E-2, rear frame rail 122E, and front frame rail 126E (which defines front opening 123E). Cover 150E includes a top plate 151E defining four upper rivet holes 155-1 to 155-4, and cover 150E is disposed over an upper surface of the PCBA 50 such that each of the rivet sets (i.e., one of female rivet portions 171-1 to 171-4 and a corresponding male rivet portion 175-1 to 175-4) extends through a corresponding upper rivet hole 155-1 to 150-4, whereby cover 150E is secured to support structure 110E and the PCBA by said plurality of rivet sets, whereby cover 150E and support structure 110E form a housing that operably encloses PCBA 50 (i.e., such that only connector 60 is accessible from outside the housing, as indicated in FIGS. 16(A) and 16(B)). Similar to the previous embodiments, both cover 150E and support structure 110E are die-cast metal structures. As shown in FIG. 16(A), when assembly is completed, associated portions of rivet sets 170-1 to 170-4 are exposed on the outer (upper) surface of top plate 151E. Note also that support structure 110E includes a bottom plate 141E, and rivet holes 125-1 to 125-4 extend through bottom plate 141E such that, as indicated in FIG. 16(B), associated portions of rivet sets 170-1 to 170-4 are exposed on the lower surface of bottom plate 141E.

Figure 17:
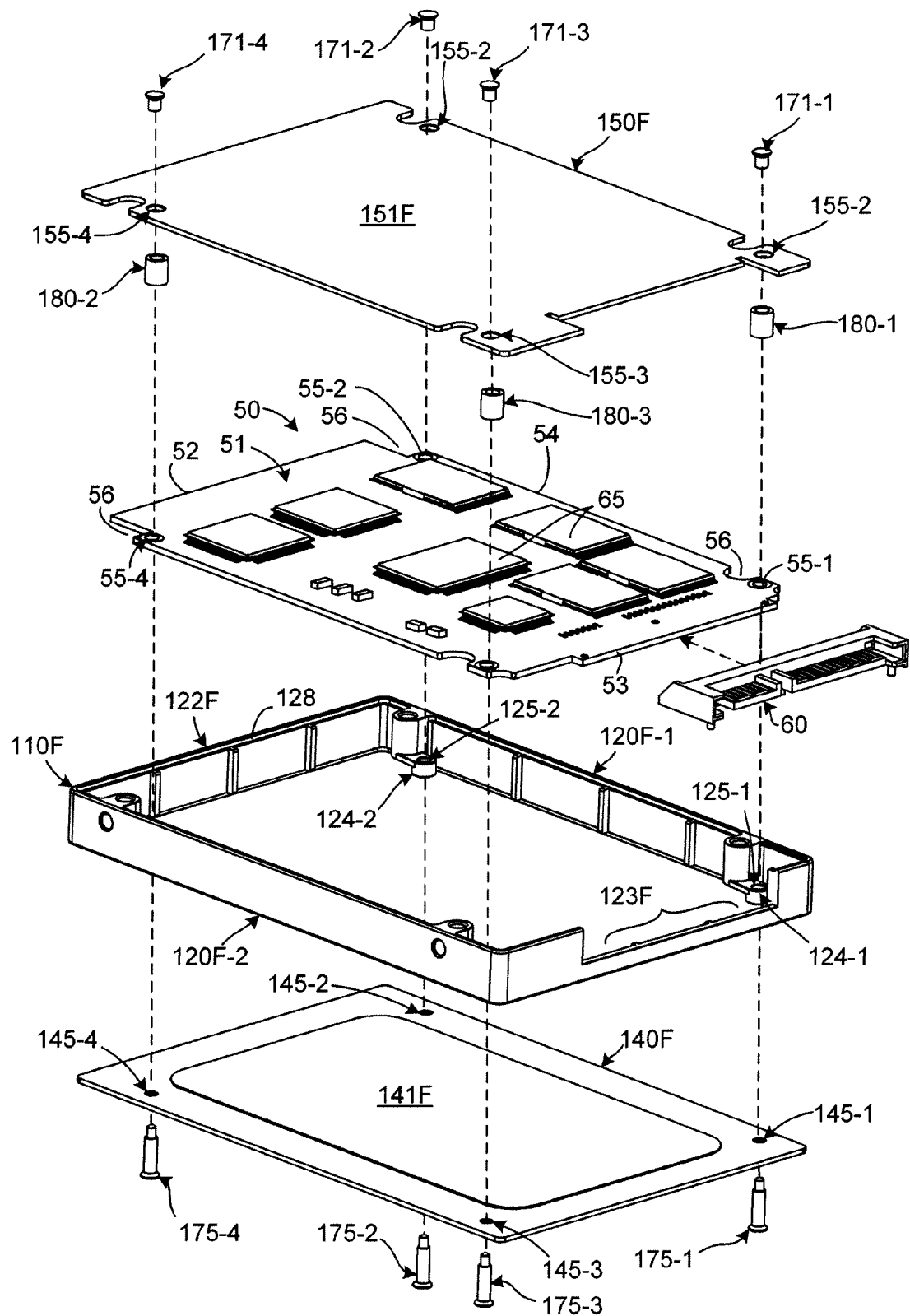
FIG. 17 is an exploded perspective view showing an SSD device according to another embodiment of the present invention.
Figure 18A:
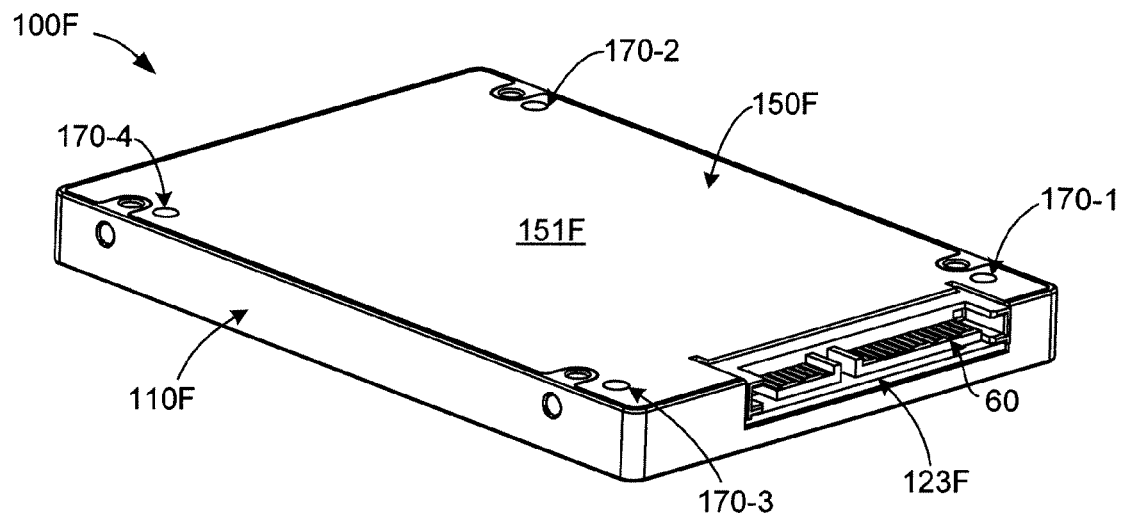
FIGS. 18(A) and 18(B) are top and bottom perspective views, respectively, showing the SSD device of FIG. 17 in a fully assembled state.
Figure 18B:
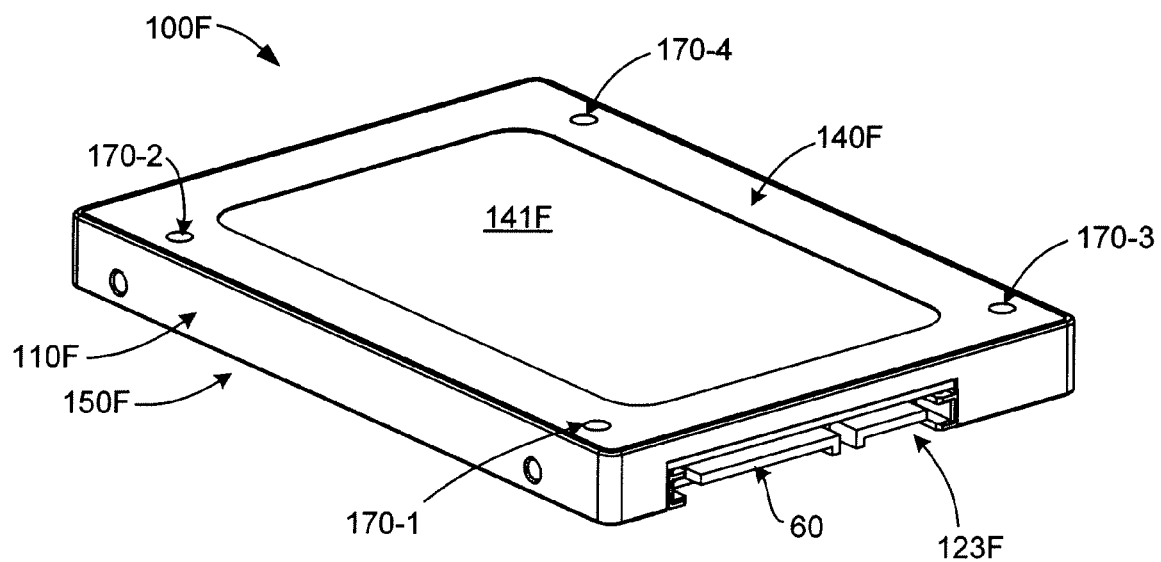

FIGS. 17, 18(A) and 18(B) are exploded and assembled perspective views showing an SSD device 110F according to a fifth alternative embodiment. Similar to the SSD device 100E, SSD device 100F includes PCBA 50 mounted on a support structure 110F having side frame rails 120F-1 and 120F-2, rear end frame rail 122F, front end frame rail 126F, with side frame rails 120F-1 and 120F-2 including rivet holes 125-1 to 125-4 similar to those described in the embodiments above. However, SSD device 100F differs from the previous embodiments in that support structure 100F is molded plastic, and SSD device 100F includes a metal bottom panel 140F mounted against lower edge portions of support structure 100F, and a metal top panel 150F mounted against upper edge portions of support structure 100F. Each metal panel forms a wall that defines pre-punched rivet holes that coincide with rivet holes 125-1 to 125-4, with metal top panel 150F including an upper wall 151F defining upper rivet holes 155F-1 to 155F-4, and metal bottom panel 140F including a lower wall 141F defining lower rivet holes 145F-1 to 145F-4.

During assembly, top metal panel 150F is disposed over an upper surface of the PCBA 50 and mounted such that each of the rivet sets (i.e., one of female rivet portions 171-1 to 171-4 and a corresponding male rivet portion 175-1 to 175-4) extends through a corresponding upper rivet hole 155-1 to 150-4, through a corresponding rivet hole 125-1 to 125-4, and through a lower rivet hole 145-1 to 145-4, whereby metal panels 140F and 150F are secured to support structure 110F and PCBA 50 by the rivet sets such that panels 140F and 150F and support structure 110F form a housing that operably encloses PCBA 50 (i.e., such that only connector 60 is accessible from outside the housing, as indicated in FIGS. 18(A) and 18(B)). As shown in FIG. 18(A), when assembly is completed, associated portions of rivet sets 170-1 to 170-4 are exposed on the outer (upper) surface of top plate 151F and the outer (lower) surface of bottom plate 141F. Referring again to FIG. 17, optional spacers 180-1 to 180-4 are utilized to securely hold PCBA 50 between metal panels 140F and 150F. By forming SSD device 100F using plastic support structure (frame) 110F and thin metal panels 140F and 150F that are reliably secured over the PCBA by rivet sets 170-1 to 170-4, SSD device 100F is formed in accordance with the present invention that is both light-weight and durable, thereby providing a highly desirable storage device for portable computing systems, such as laptop computers. In particular, light-weight SSD device 100F eliminates the heavy metal casing and screws required by conventional SSD structures while providing effective protection for the enclosed electronic components and a firm and secure platform for the plug connector (so that the plug connector will not become loose and separated from the housing after extended usage), and also simplifies assembly work.

Although the present invention has been described with respect to certain specific embodiments, it will be clear to those skilled in the art that the inventive features of the present invention are applicable to other embodiments as well, all of which are intended to fall within the scope of the present invention.

The invention claimed is:

1. A Solid State Drive (SSD) device comprising:
   a printed circuit board assembly (PCBA) including a printed circuit board (PCB) defining a plurality of rivet holes that are disposed adjacent to opposing side edges thereof, a connector mounted on a front edge of the PCB, and a plurality of integrated circuit (IC) devices mounted onto one or more surfaces of the PCB;
   a support structure including first and second parallel side frame rails defining a front end opening therebetween, each of the first and second side frame rails defining a plurality of rivet openings and support platforms for receiving and supporting the side edges of the PCB; and
   a plurality of rivet sets, each rivet set including an associated female rivet portion having a first end cap and an elongated first body defining a central opening, and an associated male rivet portion having a second end cap and an elongated second body,
   wherein the PCBA is mounted onto the support structure such that the plug connector is exposed through the front end opening, and such that each rivet hole of the plurality of rivet holes is aligned with a corresponding rivet opening of the plurality of rivet openings, and
   wherein each rivet set extends through an associated rivet hole and its corresponding rivet opening such that the elongated second body of the associated male rivet portion is fixedly engaged in the central opening of the associated female rivet portion, and such that the PCBA and the support structure are held between the first and second end caps.

2. The SSD device of claim 1,
   wherein the opposing side edges of the PCB further define one or more alignment notches,
   wherein the first and second parallel side frame rails further comprise one or more alignment structures disposed such that, when the PCB is mounted onto the support structure with each said alignment structure received inside a corresponding said alignment notch, each said rivet hole is aligned with its corresponding rivet opening.

3. The SSD device of claim 1,
   wherein the PCBA further comprises ground conductors connected to each of said a plurality of IC devices, and at least one metal ground ring surrounding at least one of said rivet holes, and
   wherein at least one of said plurality of rivet sets is mounted against said at least one metal ground ring such that an electrical connection is formed by said rivet set between said at least one metal ground ring and at least one of said first and second side frame rails.

4. The SSD device of claim 1, wherein each of said plurality of rivet sets comprises one of a compression rivet structure and a blind rivet structure.

5. The SSD device of claim 1, wherein said support structure comprises first and second bracket arms respectively including said first and second parallel side frame rails, wherein the first and second bracket arms are connected solely by said PCBA.

6. The SSD device of claim 1, wherein said support structure further comprises a rear end frame rail integrally connected between respective rear end portions of said first and second parallel side frame rails.

7. The SSD device of claim 6, wherein said support structure further comprises a front end frame rail integrally connected between respective front end portions of said first and second parallel side frame rails, wherein said front frame rail defines said front opening.

8. The SSD device of claim 6,
   wherein said support structure further comprises a bottom plate integrally connected between lower edge portions of said rear end frame rail and said first and second parallel side frame rails, and
   wherein the plurality of rivet holes, extend through bottom plate 141.

9. The SSD device of claim 8, further comprises a cover mounted onto upper edges of the first and second frame rails, said cover having an top plate disposed over an upper surface of the PCBA,
   wherein the top plate defines a plurality of upper rivet holes, and wherein each of said plurality of rivet sets extends through a corresponding one of said plurality of upper rivet holes such that the cover is secured to the support structure and the PCBA by said plurality of rivet sets, whereby the cover and the support structure form a housing that operably encloses the PCBA.

10. The SSD device of claim 6, wherein the support structure comprises plastic, wherein the SSD device further comprises a metal bottom panel mounted against lower edge portions of said rear end frame rail and said first and second parallel side frame rails, said bottom panel defining a plurality of rivet holes, and wherein each of said plurality of rivet sets extends through a corresponding one of said plurality of lower rivet holes such that the bottom panel is secured to the support structure and the PCBA by said plurality of rivet sets.

11. The SSD device of claim 10, further comprises a metal top panel mounted against upper edge portions of said rear end frame rail and said first and second parallel side frame rails, said top panel defining a plurality of upper rivet holes, and wherein each of said plurality of rivet sets extends through a corresponding one of said plurality of upper rivet holes such that the top panel is secured to the bottom panel, the support structure and the PCBA by said plurality of rivet sets, whereby the top panel, the support structure and the bottom panel form a housing that operably encloses the PCBA.

12. The flash hard drive according to claim 1, wherein the SSD device is substantially the same form factor as one of a 2.5" Integrated Drive Electronics (IDE) hard-disk drive (HDD) device, and a 1.8" Integrated Drive Electronics (IDE) hard-disk drive (HDD) device.

13. The flash hard drive according to claim 1, wherein the flash hard drive comprises one of a Thin Small Outline Package (TSOP) form factor, a Very Very Small Outline Package (WSOP) form factor, a Ball Grid Array (BGA) form factor, and a Chip-on-Board (COB) form factor.

14. The flash hard drive according to claim 1, wherein the connector complies with one of Serial Advanced Technology Attachment (SATA) specifications, Integrated Drive Electronics (IDE) specifications, and Small Computer Systems Interface (SCSI) specifications.

15. A method for manufacturing a Solid State Drive (SSD) device comprising:

mounting a printed circuit board assembly (PCBA) onto a support structure, the PCBA including a printed circuit board (PCB) defining a plurality of rivet holes that are disposed adjacent to opposing side edges thereof, a connector mounted on a front edge of the PCB, and a plurality of integrated circuit (IC) devices mounted onto one or more surfaces of the PCB, the support structure including first and second parallel side frame rails defining a front end opening therebetween, each of the first and second side frame rails defining a plurality of rivet openings and support platforms for receiving and supporting the side edges of the PCB, wherein mounting the PCBA comprises disposing the plug connector through front end opening, and aligning each rivet hole of the plurality of rivet holes with a corresponding rivet opening of the plurality of rivet openings; and connecting the PCBA to the support structure using a plurality of rivet sets, each rivet set including an associated female rivet portion having a first end cap and an elongated first body defining a central opening, and an associated male rivet portion having a second end cap and an elongated second body, wherein connecting each rivet set comprises extending the associated female rivet portion and the associated male rivet portion through an associated rivet hole and its corresponding rivet opening such that the elongated second body of the associated male rivet portion is fixedly engaged in the central opening of the associated female rivet portion, and such that the PCBA and the support structure are held between the first and second end caps.

16. The method of claim 15, wherein connecting the PCBA comprises utilizing an automated riveting tool.

* * * * *